(12) United States Patent
Knoedgen et al.

(10) Patent No.: US 7,176,665 B2
(45) Date of Patent: Feb. 13, 2007

(54) ANALOG CURRENT SENSE CIRCUIT

(75) Inventors: Horst Knoedgen, München (DE); Eric Marschalkowski, Inning (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 265 days.

(21) Appl. No.: 10/874,475

(22) Filed: Jun. 22, 2004

(65) Prior Publication Data
US 2005/0275393 A1 Dec. 15, 2005

(30) Foreign Application Priority Data
Jun. 14, 2004 (EP) .................................. 04392026

(51) Int. Cl.
G05F 1/40 (2006.01)
G05F 1/56 (2006.01)
H02H 7/00 (2006.01)

(52) U.S. Cl. ...................................... 323/282; 323/271

(58) Field of Classification Search ................ 323/268, 323/270, 271, 273–277, 279, 282, 284–288, 323/290, 908
See application file for complete search history.

(56) References Cited

U.S. PATENT DOCUMENTS

| | | | | |
|---|---|---|---|---|
| 5,723,974 A | 3/1998 | Gray | ........................... | 323/282 |
| 6,166,528 A | 12/2000 | Rossetti et al. | .............. | 323/283 |
| 6,249,112 B1 * | 6/2001 | Khouri et al. | .............. | 323/282 |
| 6,366,068 B1 | 4/2002 | Morishita | .................... | 323/282 |
| 6,426,612 B1 | 7/2002 | Rozsypal | ..................... | 323/282 |
| 6,441,597 B1 | 8/2002 | Lethellier | .................... | 323/282 |
| 6,479,975 B1 | 11/2002 | Plankensteiner et al. | .... | 323/316 |
| 6,528,976 B1 * | 3/2003 | Lenk et al. | ................. | 323/282 |
| 6,870,354 B2 * | 3/2005 | Nishimaki | .................. | 323/284 |
| 7,009,371 B2 * | 3/2006 | Nakata | ........................ | 323/282 |
| 2003/0218455 A1 | 11/2003 | Tai et al. | ..................... | 323/316 |

FOREIGN PATENT DOCUMENTS

EP          1 079507 A      2/2001

* cited by examiner

Primary Examiner—Matthew V. Nguyen
(74) Attorney, Agent, or Firm—Saile Ackerman LLC; Stephen B. Ackerman

(57) ABSTRACT

Circuits and related methods for switched step-down and boost DC-to-DC converters have been achieved. Said DC-to-DC converters comprise an inductor current sensing and limiting circuit to prevent the inductor current to exceed a defined limit. Said current sense circuit is using the voltage on the on-state source-to-drain resistance of a power switch to monitor the inductor current. Said voltage is amplified and serves as input of a regulator. Said regulator, being connected via one or more gate controllers to the gates of said power switches, controls the ON/OFF state of said power switches by pulse-width-modulation. Said power switches are switched ON/OFF if the current exceeds a defined limit. After a defined time period said power switches are switched on again. Gate controllers keep the power switch in an operating region having a stable source-to-drain resistance while said power switch is ON. The ON/OFF duty cycle of said power transistor switches is set in a way that the difference between charge/discharge energy is kept on a minimum.

34 Claims, 3 Drawing Sheets

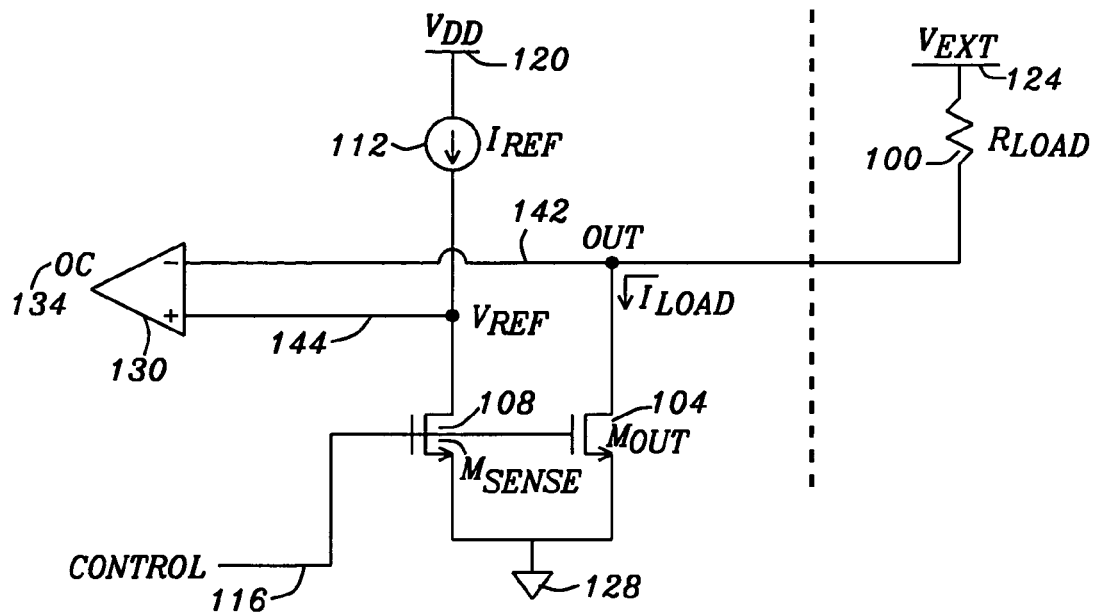
*FIG. 1 – Prior Art*
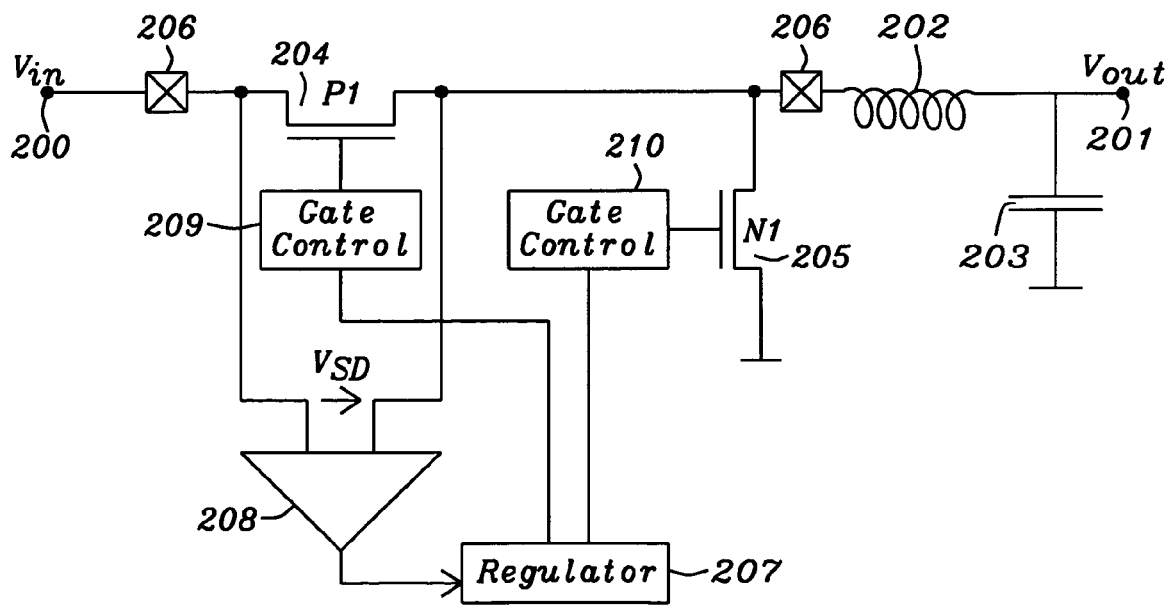
*FIG. 2*

ANALOG CURRENT SENSE CIRCUIT

BACKGROUND OF THE INVENTION (1) Field of the Invention

The present invention relates generally to voltage control unit circuits, and more particularly, to DC-DC converters having an analog MOS current sense circuit.

(2) Description of the Prior Art

Current sense circuits are widely used in integrated circuits. If a potentially large output current, or load current, must be driven by an on-chip switch, a current sense circuit may be used to detect the relative or absolute value of this current. The current level may be monitored to prevent damage to the switch, or to the integrated circuit from either a short circuit or a simple overloading.

Referring now to FIG. 1 prior art, a simplified schematic of a current sense circuit, as disclosed in the U.S. Pat. No. 6,479,975 by Plankensteiner et al. is illustrated. The load current is sensed for a low-side driver output comprising an NMOS output transistor 104. The gate of said transistor 104 is coupled to a control signal, CONTROL 116. The drain is coupled to the output pin of the circuit, OUT 142. The source is preferably coupled to ground 128. A load 100 is coupled between OUT 142 and an external voltage source 124. Alternatively, the internal voltage source could be used. The low-side driver 104 is turned ON when the CONTROL voltage is above the threshold of transistor 104.

The current sensing is provided by the sensing transistor 108, constant current source 112, and comparator 130 in combination with the output transistor 104. More specifically, the gate of the sensing transistor 108 is coupled to CONTROL 116. The source is coupled to ground 128. In this configuration, sensing transistor 108 receives the same gate drive as 104.

A constant current source 112 is coupled to the drain of the sensing transistor 108. In this configuration, the ON-state drain current of transistor 108 corresponds exactly to the current generated by said current source 112 since the current flow into the high impedance inputs of the comparator 130 is negligible. Further, as long as current source 112 is below the saturation current of sense transistor 108, the sense transistor will operate in the linear region. By maintaining sense transistor 108 operation in the linear, or ohmic region, the operating characteristics of transistor 108 will match those of output transistor 104.

Several prior art inventions describe current sensing circuits used in DC-DC converters:

U.S. Pat. No. 6,441,597 (to Lethellier) discloses a current sense circuit for a DC-to-DC power converter accurately sensing the output inductor current without adversely affecting efficiency of the power converter. The current sense circuit produces a current sense signal having amplitude sufficiently above the noise floor so that accurate load control of the power converter is achieved. Specifically, the DC-to-DC power converter includes at least one power switch connected to an input voltage source. At least one phase sensing switch is connected to the input voltage source in parallel with the at least one power switch. A pulse width modulation circuit provides common control pulses for the at least one power switch and the at least one phase sensing switch responsive to a current sense signal. An output inductor is connected to the at least one power switch and to a load. A current sensor is coupled to the output inductor and providing the current sense signal to the pulse width modulation circuit corresponding to current passing through an internal DC resistance of the output inductor. The current sensor further includes a filter that includes an on-state resistance of the at least one power switch. The current sensor further includes a second filter adapted to remove noise from the current sense signal when the at least one phase sensing switch and the at least one power switch change state.

U.S. Pat. No. 6,426,612 (to Rozsypal) teaches a current sense circuit which receives a signal indicative of output current flow of an up/down DC-DC converter during up-conversion and down-conversion modes. The current sense circuit provides a logic signal indicative of the rate of change of the current flow for both modes of operation. A comparator receives a selectable voltage reference generated by voltage reference. A first voltage reference is selected during an increasing current flow and a second voltage reference is selected during a decreasing current flow, thereby regulating the output current to a fixed average value. If the length of time during continuous current flow of converter exceeds a predetermined amount of time, a signal is issued and externally processed, which subsequently disables converter by an external signal.

SUMMARY OF THE INVENTION

A principal object of the present invention is to achieve DC-to-DC converter circuits and methods that accurately sense and limit the inductor current.

A further object of the present invention is to achieve circuits and methods to sense and limit the inductor current of DC-to-DC converters, which are simple in design and manufacturability.

In accordance with the objects of this invention a current-limiting step-down DC-to-DC power converter has been achieved. Said power converter comprises, first, a high-side power switch connected to an input voltage source and to an inductor, a low side power switch connected to ground and to said inductor, an amplifying means to amplify the voltage on the on-state source-to-drain resistance of said high-side power switch as input to a regulator, and a regulator having an input and an output, wherein the input is said amplified voltage and the output are signals to a gate controller setting said high-side power switch and said low-side power switch ON or OFF, preventing the current through an inductor to exceed a limit and to achieve a duty cycle keeping the difference between charge/discharge energy to a minimum. Furthermore said power converter comprises a capacitor being connected on one side to ground and on the other side to an output port and to said inductor, an inductor being connected on one side to said high-side power switch and to said low-side power switch and on the other side to an output port, and a gate controller to control the gate voltages of each of said high-side power switch and low-side power switch having as input signals from said control unit.

In accordance with the objects of the invention a method to provide over-current protection of a step-down DC-to-DC converter has been achieved. Said method comprises, first, providing a high-side transistor switch, a low-side transistor switch, an amplifier, a gate controller, a regulator, an inductor, and a capacitor. The steps of said method are to switch ON high-side switch and to switch OFF low-side switch at the same time initiated by said regulator, to switch OFF high-side transistor switch and switch ON low-side transistor switch if current limit is reached, which is sensed by the amplifier, and to establish duty cycle by regulator.

In accordance with the objects of the invention a current-limiting boost DC-to-DC power converter has been achieved. Said power converter comprises, first, a power switch connected to on one side to ground and on the other side to an inductor and to a rectifying means, a rectifying means, an amplifying means to amplify the voltage on the on-state source-to-drain resistance of said power switch, and a regulator having an input and an output, wherein the input is said amplified voltage and the output are signals a gate controller to set said power switch ON or OFF depending if said the current through an inductor is exceeding a limit and to achieve a duty cycle keeping the difference between charge/discharge energy to a minimum. Furthermore said power converter comprises a capacitor being connected on one side to ground and on the other side to an output port and to said rectifying means, an inductor being connected on one side to an input voltage source and on the other side to said rectifying means and to said power switch, and a gate controller to control the gate voltage of said power switch having as input signals from said regulator.

In accordance with the objects of the invention a method to provide over-current protection of a boost DC-to-DC converter has been achieved. Said method comprises, first, providing a power transistor switch, an amplifier, a gate controller, a regulator, an inductor, a rectifying means, and a capacitor. The steps of said method are to close power transistor switch, to sense voltage on on-state resistance RDSON of power transistor switch by an amplifier, to open power transistor switch if current limit is reached, which is sensed by the amplifier; and to establish duty cycle by regulator.

BRIEF DESCRIPTION OF THE DRAWINGS

In the accompanying drawings forming a material part of this description, there is shown:

FIG. 1 prior art shows a schematic of a prior art circuit.

FIG. 2 shows a schematic of a current-limited step-down DC-to-DC converter invented.

DESCRIPTION OF THE PREFERRED EMBODIMENTS

Figure 3:
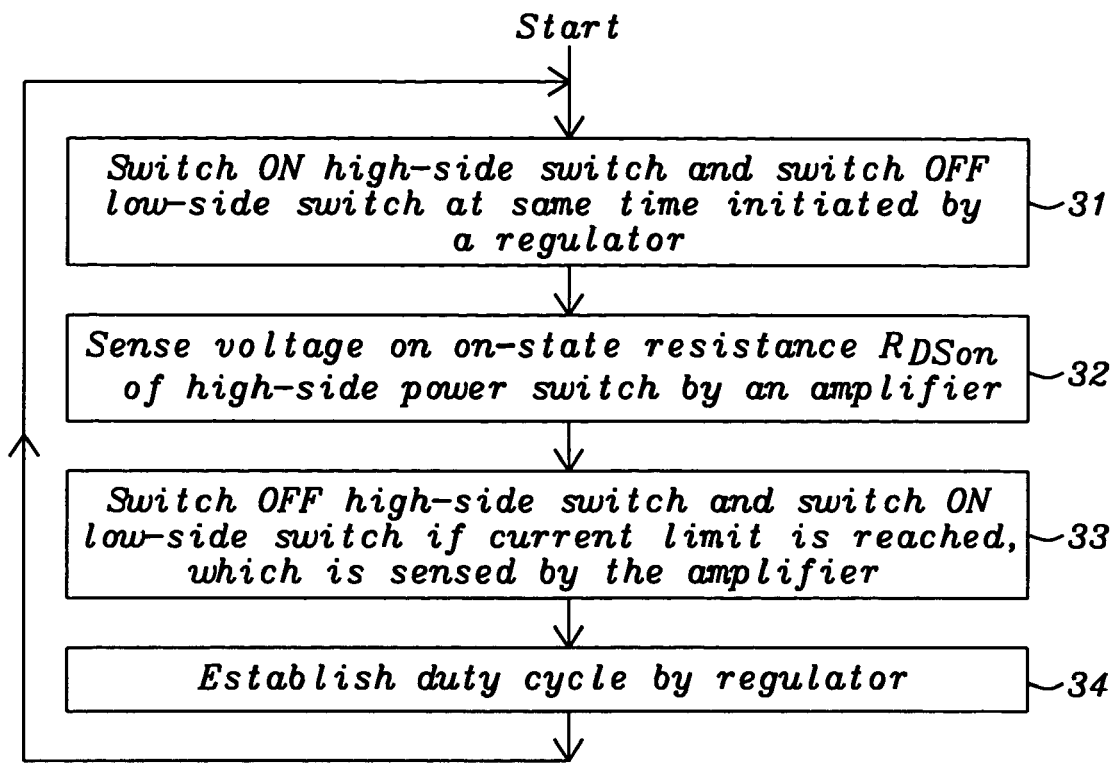
FIG. 3 shows a flowchart of a method to limit the current of a step-down DC-to-DC converter.

The preferred embodiments disclose DC-to-DC switched mode converters having a novel current sense circuit. Said power converters having a current sense and a current limiting circuit are described in two embodiments. It should be clear to those experienced in the art that the present invention can be applied and extended without deviating from the scope of the present invention.

Referring now to FIG. 2 a first embodiment of the present invention is illustrated. Said analog current sense and limiting circuit is applied to a buck-type DC-to-DC switched mode power converter. Said circuit has an input voltage $V_{in}$ 200 and an output voltage $V_{out}$ 201. An external inductor 202 and an external capacitor 203 are used as energy-storage element to transfer energy from input to output in discrete packages. With the exception of the external inductor 202 and the external capacitor 203 all components of the circuit are integrated in an IC. The pins 206 connect said IC with the external components. A high-side switch 204, embodied by a PMOS power transistor P1, selectively couples the inductor 202 to positive power supply via the input voltage $V_{in}$, and a low-side switch 205, embodied by a NMOS power transistor N1, selectively couples the inductor 202 to ground. An amplifier 208 amplifies the source-to-drain voltage 211 of power transistor 204. The output of said amplifier is the input of a regulator 207. Said regulator 207 is opening and closing said power transistors switches P1 and N1 via gate controllers 209 respective 210. Alternatively the gates of the power transistor switches 204 and 205 could be controlled by one common gate controller receiving input from said regulator 207.

The power transistor P1 204 is operating in the linear, ohmic region when the control signal generated by regulator 207 via the gate controller 209 is ON. In other words said power transistor P1 is switched ON using a gate voltage of e.g. three times the threshold voltage of P1. Therefore the output inductor current is accurately sensed by the voltage at the stable source-to drain resistance $R_{on}$ of P1. The operation in the linear region is established by the gate controller 209. The gate voltage is set well below the threshold voltage during the OFF phase of said transistor P1.

The power transistor switch P1 204 is set to ON by the regulator 207 via said gate controller 209 until a predefined maximum limit of the inductor current is reached. Regulator 207 is monitoring said maximum inductor current receiving input from amplifier 208, which is sensing the voltage at the on-state source-to drain resistance $R_{DSon}$ of P1. Regulator 207 controls the switches of the gate controllers 209 and 210, setting the gate voltages of P1 respective N1 either well below the threshold voltages in the OFF state or e.g. three times the correspondent threshold voltage in the ON state.

While P1 is in the ON state power transistor N1 205 is set OFF by said regulator 207. Once said inductor current reaches the defined limit, regulator 207 sets P1 to OFF and sets power transistor N1 205 to ON at the same point of time. N1 is connected to ground and is thus reducing the inductor current while it is ON. After a predefined time period, generally in the order of a microsecond, regulator 207 initiates via the gate controller 209 to set P1 ON again and via gate controller 210 to set N1 OFF at the same time. Thus said regulator 207 is establishing a duty cycle keeping the difference between charge/discharge energy as low as possible.

Said amplifier 208 is a fast amplifier with a low offset. A blanking time is required to achieve ringing suppression.

Referring now to FIG. 3 a flowchart of a method to prevent the inductor current of a DC-to-DC buck converter, as shown in FIG. 2, to exceed a defined limit is described. The first step 31 shows that, first, the high-side switch is set ON and the low-side switch is set OFF initiated by a regulator at same time. The next step 32 describes that the voltage at the on-state source-to-drain resistance of the high-side switch, representing the inductor current, is sensed by an amplifier. Step 33 shows that, if current limit is reached, which event is sensed by the amplifier, the high-side switch is set OFF and the low-side switch is set ON initiated by said regulator at the same time. Step 34 shows that said regulator is establishing a duty cycle between setting ON/OFF of said high-side switch and low-side switch going back to step.

Figure 4:
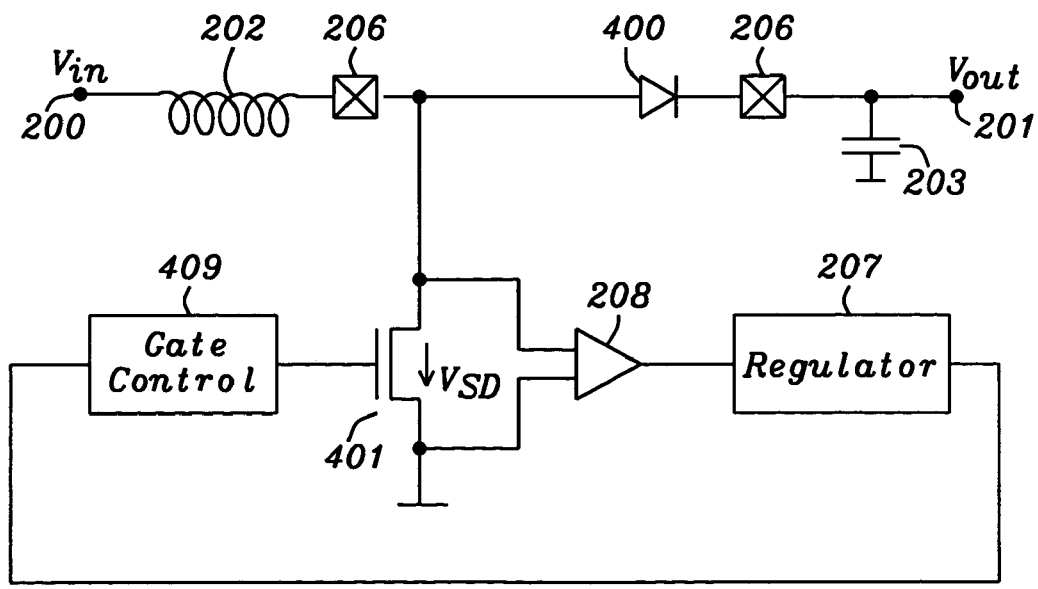
FIG. 4 illustrates a schematic of a current-limited boost DC-to-DC converter.

Referring now to FIG. 4 a second embodiment of the present invention is illustrated. Said analog current sense circuit is applied now to a boost DC-to-DC switched mode power converter. Said circuit has, again, an input voltage $V_{in}$ 200 and an output voltage $V_{out}$ 201. An external inductor 202 and an external capacitor 203 are used as energy-storage element to transfer energy from input to output in discrete packages. Said inductor 202 is connected to the input voltage $V_{in}$, to a power transistor switch 401, and to a diode 400. Said capacitor 203 is connected on one side to ground and on the other side to the output voltage $V_{out}$ 201 and to said diode 400. Said diode 400 prevents capacitor 203 to discharge while said power transistor switch 401 is closed. With the exception of the external inductor 202 and the external capacitor 203 all components of the circuit are integrated in an IC. The pins 206 connect said IC with external components.

A power transistor switch 401, embodied by a NMOS POWER transistor, selectively couples the inductor 202 to ground. The amplifier 208 amplifies the source-to-drain voltage $V_{SD}$ of power transistor 401. The output of said amplifier is the input of a regulator 207. Said regulator 207 is opening and closing said power transistor switch 401 via the gate controller 409. During the charge phase of the inductor 202, when the power switch 401 is closed, the input voltage is impressed across the inductor 202 and the diode 400 prevents the capacitor 203 from discharging to ground. The current through the inductor 202 rises linearly with time until a maximum current is reached and the power transistor switch 401 is opened and the discharge phase starts. When the power transistor switch 401 opens, the voltage across the inductor changes to whatever is required to maintain current flow because the inductor current can't change instantly.

The power transistor 401 is operating in the linear region when the control signal generated by the regulator 207 via the gate controller 409 is ON. Therefore the output inductor current is accurately sensed by the voltage at the stable source-to drain resistance $R_{SDon}$ of said power transistor 401. The operation in the linear region is established by the gate controller 409. The gate voltage is set well below the threshold voltage during the OFF phase of said transistor 401 while during the ON-phase the gate voltage is set e.g. to three times the threshold voltage.

The power transistor 401, acting as a switch, is set to ON by the regulator 207 via the gate controller 409 until a predefined maximum limit of the inductor current is reached. Regulator 207 is monitoring said maximum inductor current via amplifier 208, sensing the voltage at the source-to drain resistance $R_{SDon}$ of power transistor 401. Once said inductor current reaches the defined limit, control unit 207 sets P1 to OFF and the current through the inductor is charging capacitor 203 through the diode 400. After a predefined time period, generally in the order of a microsecond, the control unit 207 initiates via the gate controller 409 to set power switch 401 ON again until the maximum inductor current is reached. Thus said control unit is establishing a duty cycle keeping the difference between charge/discharge energy as low as possible.

Figure 5:
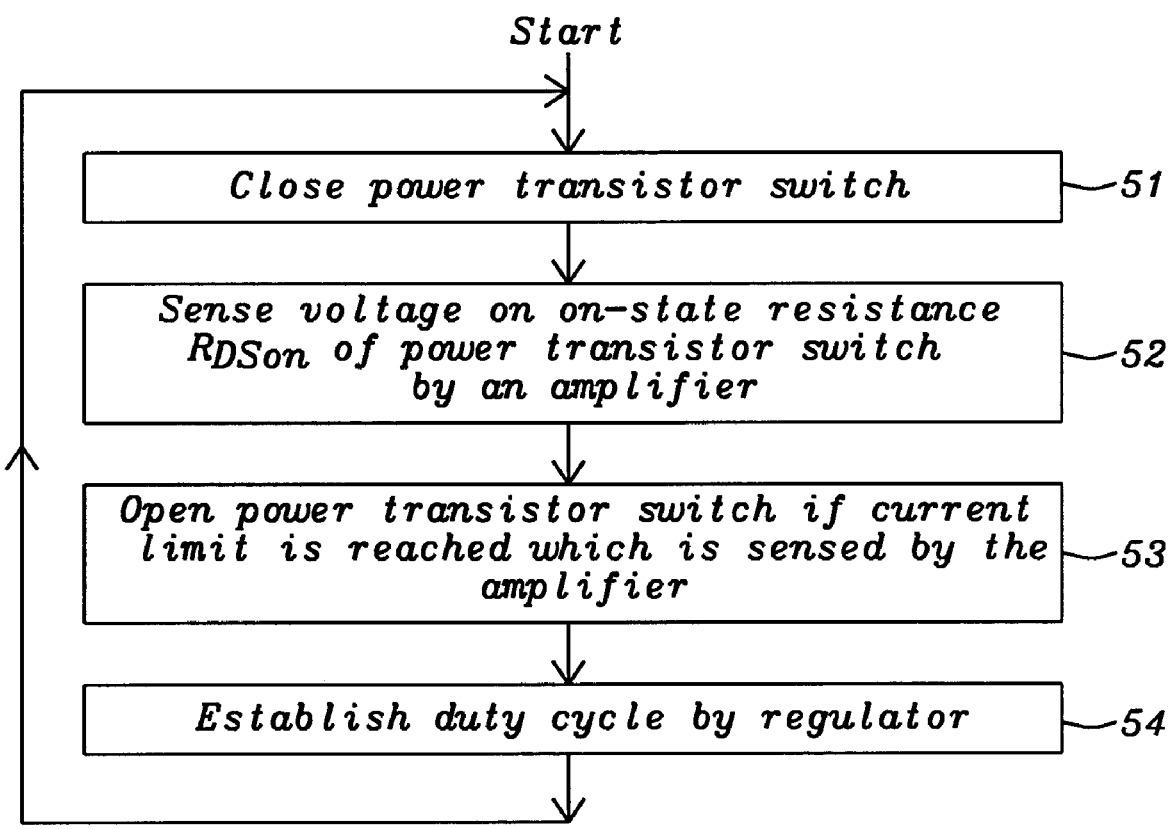
FIG. 5 shows a flowchart of a method to limit the current of a boost DC-to-DC converter.

Referring now to FIG. 5, a flowchart of a method to prevent the inductor current of a DC-to-DC boost converter, as shown in FIG. 4, to exceed a defined limit is described. The first step 51 shows that first the power transistor switch is closed. The next step 52 describes that the voltage at the on-state source-to-drain resistance of said power transistor switch, representing the inductor current, is sensed by an amplifier. Step 53 shows that said power transistor switch is opened when a current limit is reached. This is initiated by a regulator receiving input by said amplifier. In step 54 said regulator established an ON/OFF duty cycle going back to step 51.

While the invention has been particularly shown and described with reference to the preferred embodiments thereof, it will be understood by those skilled in the art that various changes in form and details may be made without departing from the spirit and scope of the invention.

What is claimed is:

1. A current-limiting step-down DC-to-DC power converter, comprising:
    a high-side power switch connected to an input voltage source and to an inductor;
    a low side power switch connected to ground and to said inductor;
    an amplifying means to amplify the voltage on the on-state source-to-drain resistance of said high-side power switch as input to a regulator;
    a regulator having an input and an output, wherein the input is said amplified voltage and the output are signals to a gate controller setting said high-side power switch and said low-side power switch ON or OFF preventing the current through said inductor to exceed a limit and to achieve a duty cycle keeping the difference between charge/discharge energy to a minimum;
    a capacitor being connected on one side to ground and on the other side to an output port and to said inductor;
    said inductor being connected on one side to said high-side power switch and to said low-side power switch and on the other side to an output port; and
    a gate controller to control the gate voltages of each of said high-side power switch and low-side power switch having as input signals from said control unit.

2. The power converter circuit of claim 1 wherein said low-side power switch is a NMOS transistor.

3. The power converter circuit of claim 1 wherein said high-side power switch is a PMOS transistor.

4. The power converter circuit of claim 1 wherein said regulator is controlling the setting of power switches by pulse-width modulation signals.

5. The power converter circuit of claim 1 wherein said gate controller is setting the gate voltage below the threshold voltage of said power switches if they are put into an OFF state.

6. The power converter circuit of claim 1 wherein said gate controller is setting the gate voltage of said power switches in a way that said power switches operate in the linear ohmic region if they are put into an ON state.

7. The power converter circuit of claim 6 wherein said gate controller is setting the gate voltage three times the threshold voltage of said power transistors if they are put into an ON state.

8. The power converter circuit of claim 1 wherein all components except said inductor and said capacitor are integrated on an IC.

9. The power converter circuit of claim 1 wherein one gate controller is provided for each power switch transistor.

10. The power converter circuit of claim 9 wherein said gate controllers are setting the gate voltage of said power switches in a way that said power switches operate in the linear ohmic region if they are put into an ON state.

11. The power converter circuit of claim 10 wherein said gate controllers are setting the gate voltage three times the threshold voltage of said power transistors if they are put into an ON state.

12. The power converter circuit of claim 9 wherein said gate controllers are setting the gate voltage below the threshold voltage of said power switches if they are put into an OFF state.

13. A method to provide over-current protection of a step-down DC-to-DC converter comprising:
    providing a high-side transistor switch, a low-side transistor switch, an amplifier, a gate controller, a regulator, an inductor, and a capacitor;

switch ON high-side switch and switch OFF low-side switch at the same time initiated by said regulator;

switch OFF high-side transistor switch and switch ON low-side transistor;

switch if current limit is reached, which is sensed by the amplifier; and establish duty cycle by regulator.

14. The method of claim 13 wherein said regulator is controlling the setting the gates of said power switches by pulse-width modulation signals.

15. The method of claim 13 wherein said gate controller is setting the gate voltage below the threshold voltage of said power transistors if they are put into an OFF state.

16. The method of claim 13 wherein said gate controller is setting the gate voltage of said power switches in a way that said power switches operate in the linear ohmic region if they are put into an ON state.

17. The method of claim 16 wherein said gate controller is setting the gate voltage three times the threshold voltage of said power transistors if they are put into an ON state.

18. The method of claim 13 wherein one gate controller for each power transistor switch is controlling the gates of the correspondent transistors.

19. The method of claim 18 wherein said gate controllers are setting the gate voltage below the threshold voltage of said power transistors if they are put into an OFF state.

20. The method of claim 18 wherein said gate controllers are setting the gate voltage of said power switches in a way that said power switches operate in the linear ohmic region if they are put into an ON state.

21. The method of claim 20 wherein said gate controller is setting the gate voltage three times the threshold voltage of said power transistors if they are put into an ON state.

22. A current-limiting boost DC-to-DC power converter, comprising:

a power switch connected to on one side to ground and on the other side to an inductor and to a rectifying means;

a rectifying means;

an amplifying means to amplify the voltage on the on-state source-to-drain resistance of said power switch;

a regulator having an input and an output, wherein the input is said amplified voltage and the output are signals to a gate controller to set said power switch ON or OFF depending if said the current through an inductor is exceeding a limit and to achieve a duty cycle keeping the difference between charge/discharge energy to a minimum;

a capacitor being connected on one side to ground and on the other side to an output port and to said rectifying means;

said inductor being connected on one side to an input voltage source and on the other side to said rectifying means and to said power switch; and said gate controller to control the gate voltage of said power switch having as input signals from said regulator.

23. The power converter circuit of claim 22 wherein said power switch is a NMOS transistor.

24. The power converter circuit of claim 22 wherein said regulator is controlling the setting of said power switch by pulse-width modulation signals.

25. The power converter circuit of claim 22 wherein said gate controller is setting the gate voltage below the threshold voltage of said power switch if it is put into an OFF state.

26. The power converter circuit of claim 22 wherein said gate controller is setting the gate voltage of said power switch in a way that said power switch operates in the linear ohmic region if it is into an ON state.

27. The power converter circuit of claim 22 wherein said gate controller is setting the gate voltage three times the threshold voltage of said power transistor if it is put into an ON state.

28. The power converter circuit of claim 22 wherein all components except said inductor and said capacitor are integrated on an IC.

29. The power converter circuit of claim 22 wherein said rectifying means is a capacitor.

30. A method to provide over-current protection of a boost DC-to-DC converter comprising:

providing a power transistor switch, an amplifier, a gate controller, a regulator, an inductor, a rectifying means, and a capacitor;

close power transistor switch;

sense-voltage on on-state resistance of power transistor switch by an amplifier;

open power transistor switch if current limit is reached which is sensed by the amplifier; and establish duty cycle by regulator.

31. The method of claim 30 wherein said regulator is controlling the setting of said power transistor switch by pulse-width modulation signals.

32. The method of claim 30 wherein said gate controller is setting the gate voltage below the threshold voltage of said power transistor switch if tit is put into an OFF state.

33. The method of claim 30 wherein said gate controller sets the gate voltage of said power switch in a way that said power switch operates in the linear ohmic region if it is put into an ON state.

34. The method of claim 30 wherein said gate controller sets the gate voltage three times the threshold voltage of said power transistor if it is put into an ON state.

* * * * *